United States Patent
Asaki

(10) Patent No.: US 11,581,032 B2
(45) Date of Patent: Feb. 14, 2023

(54) APPARATUSES AND METHODS OF POWER SUPPLY CONTROL FOR TEMPERATURE COMPENSATED SENSE AMPLIFIERS

(71) Applicant: MICRON TECHNOLOGY, INC., Boise, ID (US)

(72) Inventor: Kenji Asaki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 17/235,775

(22) Filed: Apr. 20, 2021

(65) Prior Publication Data

US 2022/0336007 A1    Oct. 20, 2022

(51) Int. Cl.
| | |
|---|---|
| *G11C 5/14* | (2006.01) |
| *G11C 11/4091* | (2006.01) |
| *G11C 11/4076* | (2006.01) |
| *G11C 11/4094* | (2006.01) |
| *G11C 11/4074* | (2006.01) |
| *G11C 7/06* | (2006.01) |

(52) U.S. Cl.
CPC ............ *G11C 11/4091* (2013.01); *G11C 5/14* (2013.01); *G11C 11/4074* (2013.01); *G11C 11/4076* (2013.01); *G11C 11/4094* (2013.01); *G11C 7/065* (2013.01)

(58) Field of Classification Search
None
See application file for complete search history.

(56) References Cited

U.S. PATENT DOCUMENTS

| | | | |
|---|---|---|---|
| 6,392,944 B1* | 5/2002 | Kono .................. | G11C 11/4074 327/51 |
| 2003/0048121 A1 | 3/2003 | Jung | |
| 2011/0292719 A1 | 12/2011 | Shin | |
| 2015/0046723 A1* | 2/2015 | Park ......................... | G06F 1/26 365/189.11 |
| 2015/0348611 A1* | 12/2015 | Rim ......................... | G11C 7/04 365/222 |
| 2016/0072486 A1 | 3/2016 | Yang et al. | |
| 2016/0163364 A1* | 6/2016 | Lee ........................... | G11C 7/12 365/189.11 |
| 2016/0307616 A1* | 10/2016 | Rim ...................... | G11C 29/028 |

(Continued)

OTHER PUBLICATIONS

International Search Report & Written Opinion dated Aug. 3, 2022 for PCT Application No. PCT/US2022/025394; pp. all.

*Primary Examiner* — Mushfique Siddique
(74) *Attorney, Agent, or Firm* — Dorsey & Whitney LLP

(57) ABSTRACT

An apparatus including a temperature dependent circuit is configured to receive a temperature dependent power supply voltage, and further is configured to receive a first input signal and provide a temperature dependent output signal responsive to the input signal. A power control circuit including the temperature dependent circuit is configured to receive a second input signal, and further configured provide a first control voltage based on the first temperature dependent output signal and provide a second control voltage based on the second input signal. The second control voltage has a temperature dependency based on the temperature dependent power supply voltage. A sense amplifier coupled to a pair of digit lines is configured to receive the first and second control voltages and amplify a voltage difference between the digit lines of the pair.

9 Claims, 10 Drawing Sheets

(56) References Cited

U.S. PATENT DOCUMENTS

2018/0166108 A1* 6/2018 Kim .................. G11C 5/025
2018/0308556 A1 10/2018 Baraskar et al.
2019/0156868 A1 5/2019 Won

* cited by examiner

APPARATUSES AND METHODS OF POWER SUPPLY CONTROL FOR TEMPERATURE COMPENSATED SENSE AMPLIFIERS

BACKGROUND

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. The change in voltage on the digit line may be amplified by a sense amplifier to indicate the value of the data state stored in the memory cell.

Conventional sense amplifiers are typically coupled to a pair of complementary digit lines to which a large number of memory cells are coupled. As known in the art, when memory cells are accessed, a row of memory cells is activated and sense amplifiers are used to amplify a data state for a respective column of activated memory cells by coupling each of the digit lines of the selected column to voltage supplies such that the digit lines have complementary voltage levels.

When a memory cell is accessed, the voltage of one of the digit lines increases or decreases slightly, depending on whether the memory cell coupled to the digit line is charged or not, resulting in a voltage difference between the digit lines. While the voltage of one digit line increases or decreases slightly, the other digit line serves as a reference for the sense amplifier. Respective transistors are enabled due to the voltage difference, thereby coupling the slightly higher voltage digit line to a supply voltage and the other digit line to a reference voltage, such as ground to further drive each of the digit lines in opposite directions and amplify the selected digit line signal, As the process technology of memory devices progresses, memory sense margin is becoming tighter, and the timing of the sense amplifier is becoming important. Particularly, there may be temperature-dependent differences in the timing of certain signals in the sense amplifier. To address such temperature dependence differences, sense amplifier designs that alleviate temperature dependence are desired.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
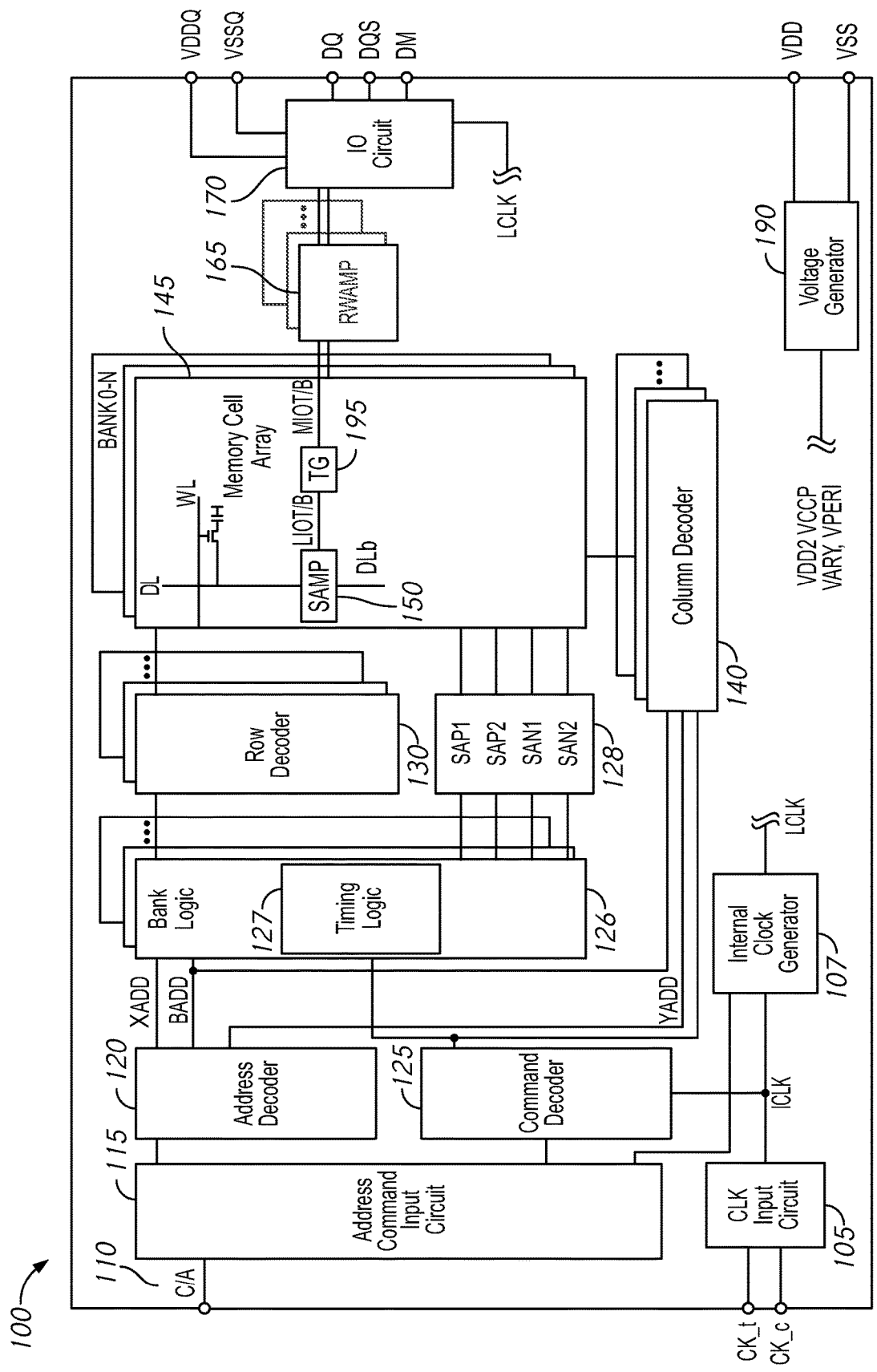
FIG. 1 is a schematic block diagram of a semiconductor device according to an embodiment of the disclosure.

FIG. 1 is a schematic block diagram of a semiconductor device 100 according to an embodiment of the disclosure. The semiconductor device 100 may include a clock input circuit 105, an internal clock generator 107, an address command input circuit 115, an address decoder 120, a command decoder 125, a plurality of row (e.g., first access line) decoders 130, a memory cell array 145, sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK_t and CK_c, data terminals DQ, DQS, and DM, and power supply terminals VDD, VSS, VDDQ, and VSSQ. The terminals and signal lines associated with the command/address bus 110 may include common terminals and signal lines that are configured to receive both command signal and address signals. In other examples, the terminals and signal lines associated with the command and address bus 110 may include a first set of terminals and signal lines that are configured to receive the command signals and a separate, second set of terminals and signal lines that configured to receive the address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of digit lines DL and DLb, and a plurality of memory cells MC arranged at intersections of the plurality of word lines WL and the plurality of digit lines DL/DLb, The selection of the word line WL for each bank BANK0-N is performed by a corresponding row decoder 130 and the selection of the digit line DL/DLb is performed by a corresponding column decoder 140. The plurality of sense amplifiers 150 are coupled to their corresponding digit lines DL and DLb, and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof.

As circuit components become smaller, clock speeds become faster, and voltage/power consumption requirements are reduced, small variances in the performance between circuit components of the sense amplifiers 150 may reduce operational reliability of the semiconductor device 100. To mitigate effects of these variations, compensating for temperature fluctuations may improve operational reliability of the semiconductor device 100.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. The internal command signals may be used to control operation and timing of various circuits of the semiconductor device 100. For example, the internal command signals may include row and column command signals to control circuits to perform access operations to selected word lines and digit lines, such as a read command or a write command.

Accordingly, when activate and read commands are issued and a row address and a column address are timely supplied with the activate and read commands, read data is read from a memory cell in the memory cell array 145 designated by the row address and the column address. The read/write amplifiers 165 may receive the read data DQ and provide the read data DQ to the IO circuit 170, The IO circuit 170 may provide the read data DQ to outside via the data terminals DQ, DQS and DM together with a data strobe signal at DQS and a data mask signal at DM. Similarly, when activate and write commands are issued and a row address and a column address are timely supplied with the activated and write commands, and the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may he written in the memory cell designated by the row address and the column address.

For each memory bank BANK0-7, a bank logic circuit 126 may be included. In some embodiments, the bank logic circuit 126 may receive the internal command signals from the command decoder 125. The bank logic circuit 126 may include a timing logic circuit 127. The timing logic circuit 127 may provide transistor activation signals to a power control circuit 128. The power control circuit 128 may provide power control signals SAP1, SAP2, SAN1, SAN2 and the like to the sense amplifiers 150 in the memory cell array 145.

The power supply terminals may receive power supply voltages VDD, and VSS. These power supply voltages VDD and VSS may be supplied to a voltage generator circuit 190. The voltage generator circuit 190 may generate various internal voltages, VDD2, VARY, VPERI and the like based on the power supply voltages VDD and VSS. A voltage VCCP may also be internally generated. The internal voltages VDD2, and VARY are mainly used in the sense amplifiers 150 included in the memory cell array 145, and the voltage VPERI is used in many other circuit blocks. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
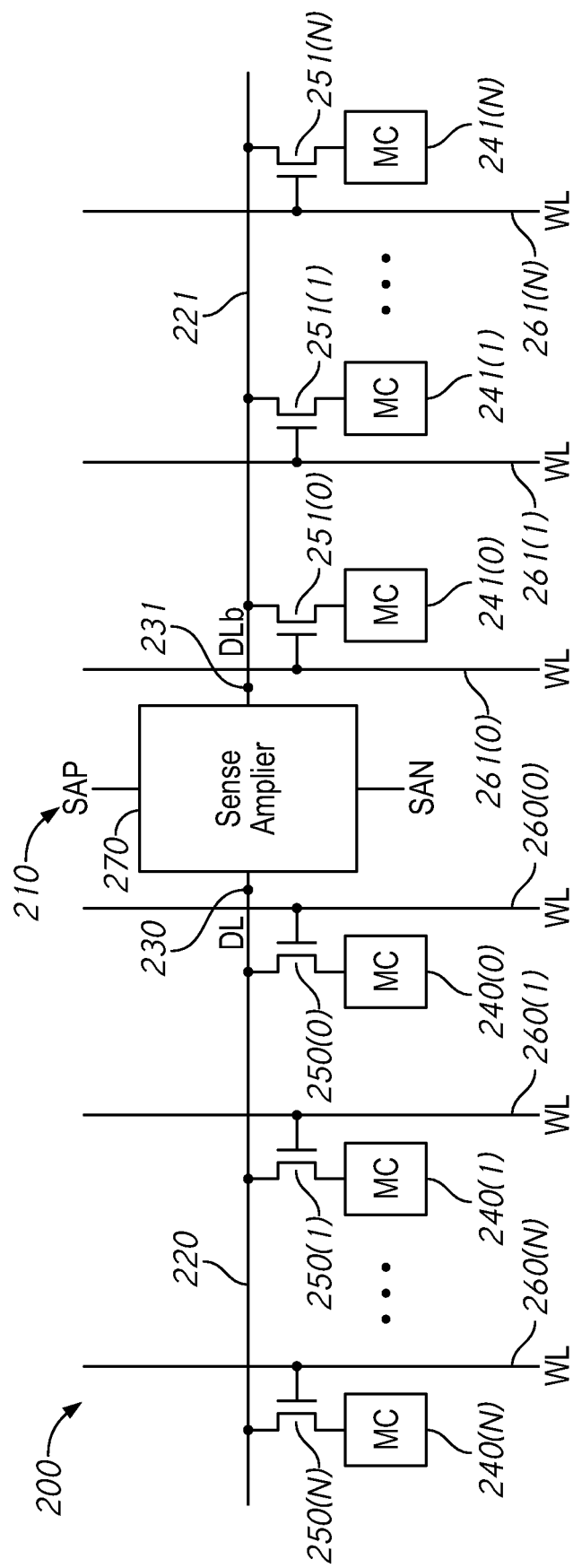
FIG. 2 is a schematic diagram of a sense amplifier and a pair of complementary digit lines according to an embodiment of the disclosure.

FIG. 2 is a schematic diagram of a portion of a memory 200 that includes a sense amplifier 210 and a pair of complementary digit lines DL 220 and DLb 221 according to an embodiment of the disclosure. As shown in FIG. 2, the sense amplifier 210 is coupled to the pair of true and complementary digit (or bit) lines DL 220 and DLb 221 at sense nodes 230 and 231, respectively. The memory cells 240(0)-(N) may be selectively coupled through respective access devices (e.g., transistors) 250(0)-(N) to the digit line DL 220 and memory cells 241(0)-(N) may be selectively coupled through respective access devices (e.g., transistors) 251(0)-(N) to the digit line DLb 221. Wordlines WL 260(0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DLb 221 by controlling a gate of a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof.

In a cell information sampling phase, a wordline WL of the wordlines WL 260(0)-(N) and 261(0)-(N) may be set to an active state, and, in response, an access device of the access devices 250(0)-(N) and 251.(0)-(N) may be enabled to couple a respective memory cell of the memory cells 240(0)-(N) and 241(0)-(N) to one of the digit lines DL 220 and DLb 221. When activated, the memory cell provides a stored data state in the form of a voltage (and/or charge) to the digit line, and to a sense node of the sense amplifier 210 to which the digit line is coupled.

In a sense amplifier enable phase, the sense amplifier 210 may be activated to perform an operation to amplify a data state of the activated memory cell. That is, during the operation, a data state stored by the activated memory cell is amplified by the sense amplifier 210 to drive one of the digit line DL 220 or the digit line DLb 221 to a high or low voltage level corresponding to the sensed data state and to drive the other digit line of the digit lines DL 220 and DLb 221 to the complementary (opposite) voltage level during the sense operation.

With reference to the memory cells 240(0)-(N), a memory cell of the memory cells 240(0)-(N) is coupled to the digit line DL 220 through the respective access device 250(0)-(N) in response to a respective word line 260(0)-(N) becoming active. A data state stored by the memory cell is amplified by the sense amplifier 210 to drive the digit line DL 220 to a high or low voltage level corresponding to the sensed data state. The other digit line DLb 221 is driven to the complementary voltage level (e.g., the high voltage level is complementary to the low voltage level and the low voltage level is complementary to the high voltage level) during the sense operation. Similarly, a memory cell of the memory cells 241(0)-(N) is coupled to the digit line DLb 221 through the respective access device 251(0)-(N) in response to a respective word line 261(0)-(N) becoming active. A data state stored by the memory cell is amplified by the sense amplifier 210 to drive the digit line DLb 221 to a high or low voltage level corresponding to the sensed data state. The other digit line DL 220 is driven to the complementary voltage level during the operation.

Figure 3:
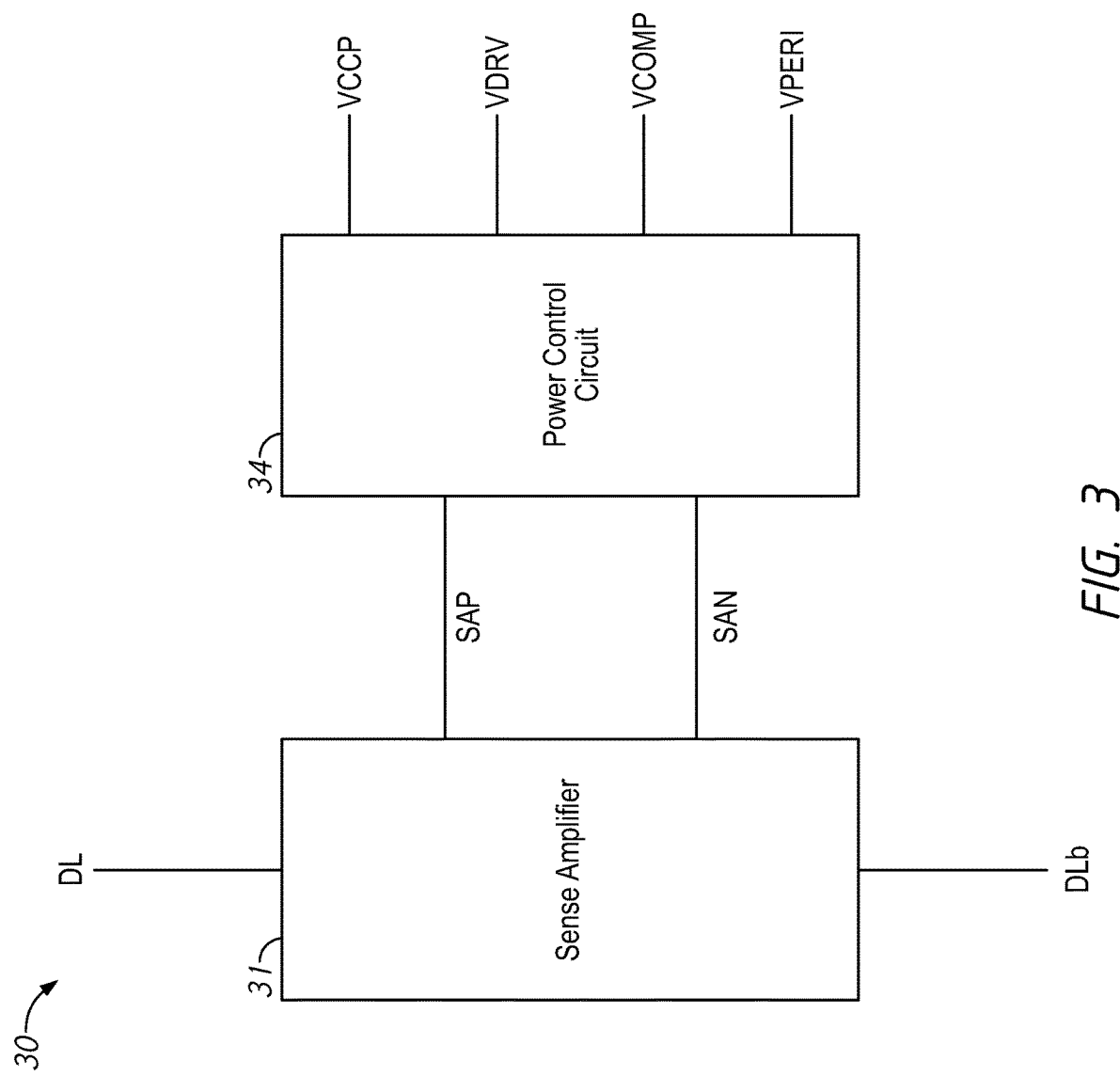
FIG. 3 is a schematic diagram of an apparatus including a sense amplifier and a power control circuit according to an embodiment of the disclosure.

FIG. 3 is a schematic diagram of an apparatus 30 including a sense amplifier 31 and a power control circuit 34 in accordance with an embodiment of the disclosure. The sense amplifier 31 may be included in one or more of the sense amplifiers 150 of FIG, 1 and/or the sense amplifier 210 of FIG. 2. As previously described, the sense amplifier 31 may drive a digit line DL to a high or low voltage level corresponding to a sensed data state. The sense amplifier 31 may also drive the other digit line DLb to the complementary voltage level (e.g., the high voltage level is complementary to the low voltage level and the low voltage level is complementary to the high voltage level) during the sense operation. The digit line DL may represent digit line DL 220 of FIG, 2 and the digit line DLb may represent digit line DLb 221 in some embodiments of the disclosure.

The voltages VCCP, VDRV, VCOMP and VPERI may be provided to the power control circuit 34. The power control circuit 34 may provide power control signals SAP and SAN to the sense amplifier 31. As will be described below, the power control circuit 34 may provide the sense amplifier 31 with the power control signal SAP controlled differently from the power control signal SAN to accommodate differences in signal timing due to temperature fluctuations. In some embodiments of the disclosure, apparatuses with sense amplifiers according to embodiments of the disclosure, including the apparatus 30 of FIG. 3, the power control circuit 34 may provide the sense amplifier 31 with more finely adjusted timing for the power control signals SAN and SAP to mitigate adverse effect due to temperature fluctuations as described in detail below.

Figure 4B:
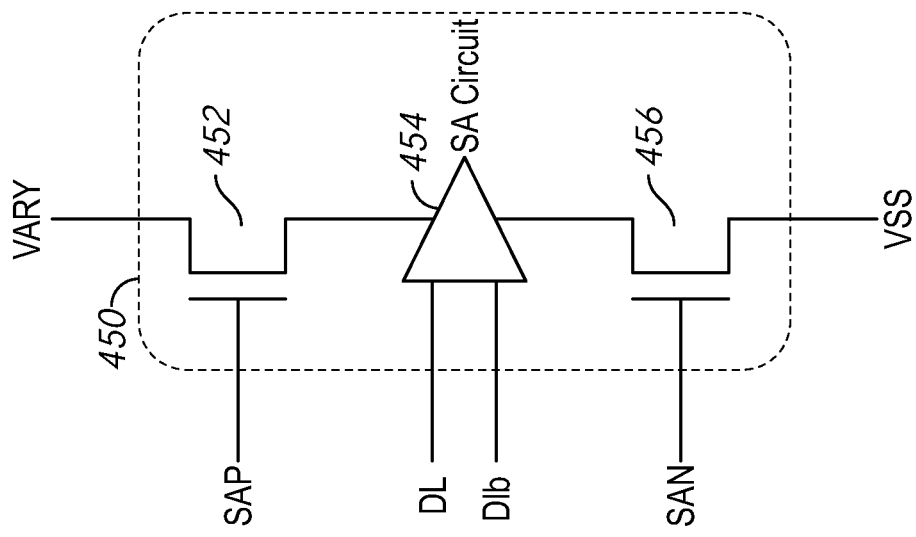
FIG. 4B is a schematic diagram of a sense amplifier according to an embodiment of the disclosure.
Figure 4A:
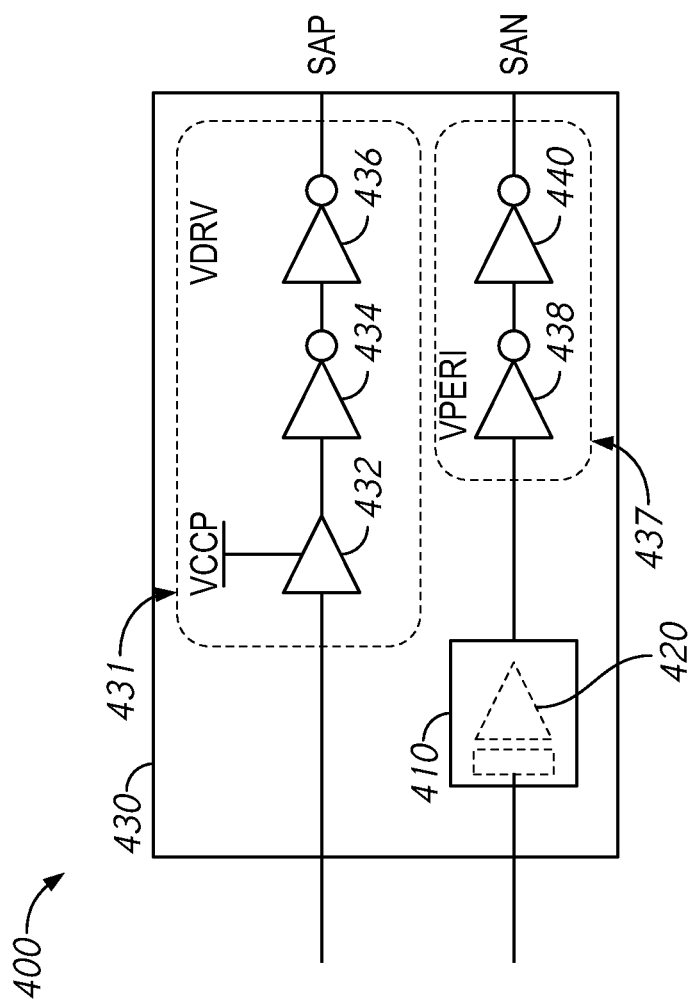
FIG. 4A is a schematic diagram of a timing circuit and a power control circuit according to an embodiment of the disclosure.

FIG. 4A is a schematic diagram of an apparatus 400 including a power control circuit 430 that includes a timing circuit 410 according to an embodiment of the disclosure. The power control circuit 430 may be an example of the power control circuit 34 of FIG. 3. The power control circuit 430 may receive an input signal from an address decoder or a command decoder of the apparatus 400 in order to assist in controlling operations of a sense amplifier 450 to detect a difference in voltages of a pair of digit lines Dl and Dlb. The power control circuit 430 may include SAP and SAN driver circuits 431 and 437 for providing power control signals SAP and SAN respectively to the sense amplifier 450. The SAP driver circuit 431 may include a driver 432 coupled to the voltage VCCP, and further includes two inverters 434 and 436 coupled in series. The voltage VCCP may have a temperature dependency as discussed below in detail. Of the two inverters 434 and 436, one of them may be coupled to a power supply voltage VDRV which is generally independent of temperature fluctuations. The SAP driver circuit 431 receives an input signal and in response outputs the power control signal SAP, The SAN driver circuit 437 may include two inverter 438 and 440 coupled in series. Of these two inverters 438 and 440, one of them may be coupled to a power supply voltage VPERI which is generally independent of temperature fluctuations. The timing circuit 410 coupled to VCCP of the SAN driver circuit 437 exhibits a temperature dependency based on the voltage VCCP that may be similar to the temperature dependency of the driver 432 of the SAP driver circuit 431. As a result, the power control signal SAN may be affected by the VCCP temperature dependency in a similar manner as the power control signal SAP. Thus, changes to the timing of the power control signals SAN may be similar to changes to the timing of the power control signal SAP. This way, operation of a sense amplifier 450 is less likely to be affected by temperature fluctuations as discussed in greater detail below.

FIG. 4B is a schematic diagram of a sense amplifier 450 according to an embodiment of the disclosure. The sense amplifier 450 may include an n-type transistor 452 and a n-type transistor 456 coupled to a sense amplifier circuit 454, The sense amplifier circuit 454 receives signals from a pair of digit lines from the memory cell array to detect a voltage difference between the pair of digit lines. In addition, the sense amplifier circuit 454 is coupled to a drain of a transistors 452 and a drain of a transistor 456. A source of the transistor 452 is coupled to the power supply voltage VARY and a source of the transistor 456 is coupled to the power supply voltage VSS. A gate of the transistor 452 is coupled to the power control signal SAP and a gate of the transistor 456 is coupled to the power control signal SAN. The sense amplifier circuit 454 may be based on any types of amplifier circuits. One type that is used in many of memory devices is a differential amplifier which detects a voltage difference in two of its inputs. For an exemplary differential amplifier such as the one shown in FIG. 4B, the timing of supplying active power control signals SAP and SAN to the sense amplifier circuit may affect the sensitivity and speed of detecting a voltage difference in the inputs of the amplifier. As was shown in FIG. 3, the power control circuit 34 receives a plurality of voltages including VCCP, VDRV, VCOMP, and VSS, which may affect timing of the power control signals SAP and SAN. The sense amplifier 450 in turn relies on the power control signals SAP and SAN to optimize the sensitivity and timing of detecting the voltage difference in the pair of digit lines.

Figure 5:
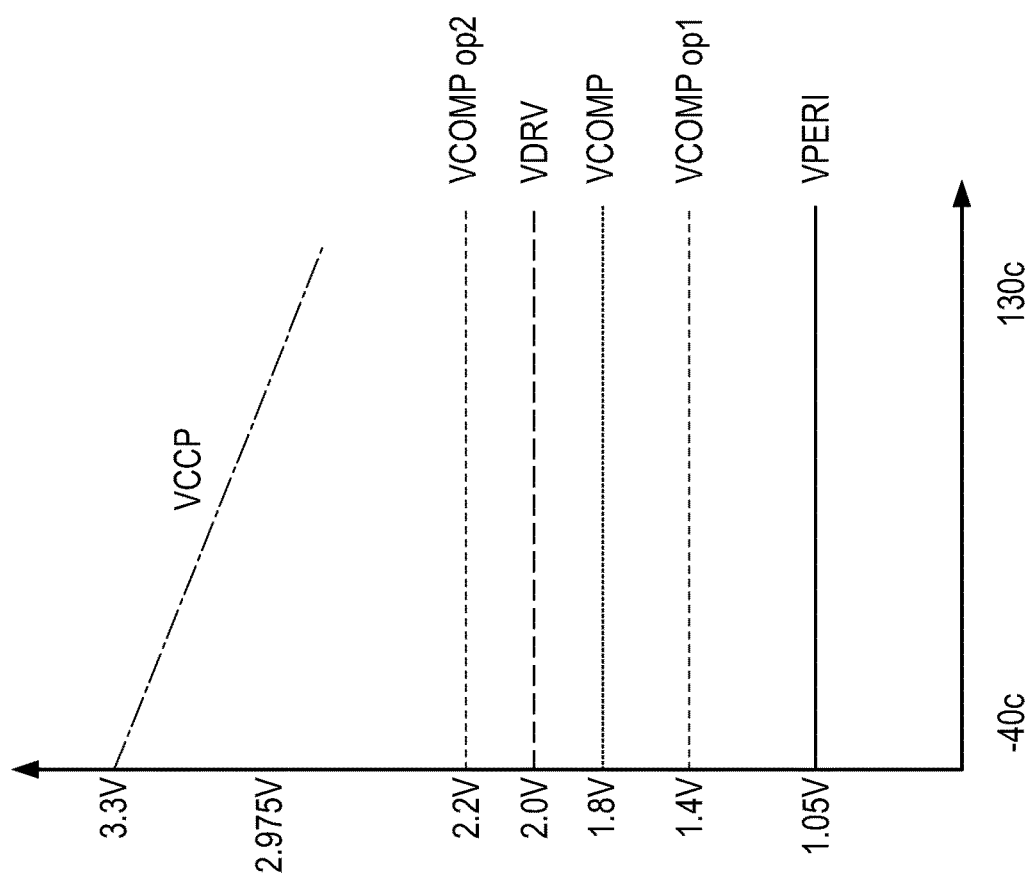
FIG. 5 is a graph of power supply voltages used in various circuits showing temperature dependence according to an embodiment of the disclosure.

FIG. 5 is a graph of various voltages used in various circuits showing temperature dependency according to an embodiment of the disclosure. In FIG. 5, a graph of voltages VCCP, VCOMP op2, VDRV, VCOMP, VCOMP op1 and VPERI are shown with the vertical axis indicative of voltage and the horizontal axis indicative of temperature. The voltage VCCP may be generated internally within the apparatus and may exhibit a temperature dependent voltage characteristic as shown in FIG. 5. However, VCCP may be provide by an external supply. In this particular example of FIG, 5, VCCP at −40° C. is around 3.3v and linearly decreases to around 2.975v at 130° C. VDRV stays substantially constant at around 2.0v from −40° C. to 130° C. VCOMP stays constant at around 1.8v from −40° C. to 130° C. VDRV stays constant at around 1.05v from −40° C. to 130° C. As VCCP has a temperature dependency and the other voltages VDRV, VCOMP and VPERI do not have a temperature dependency, the operation of the sense amplifier 450 may be affected by temperature variations of the apparatus without a temperature compensation means. The voltage VCOMP may have optional voltages VCOMP op1, VCOMP op2 and the like that can be used to further adjust the timing requirements of the power control circuit 34.

Figure 6:
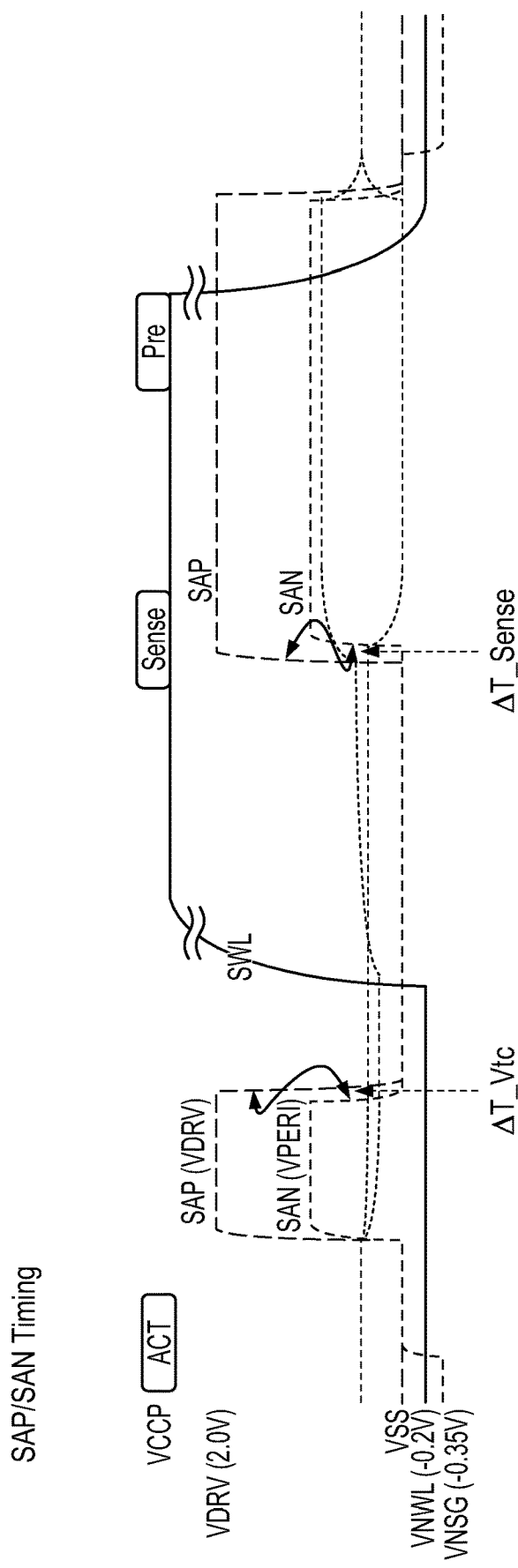
FIG. 6 is a timing diagram of various waveforms related to sense amplifier operations according to an embodiment of the disclosure.

FIG. 6 is a timing diagram of various waveforms related to sense amplifier operations according to an embodiment of the disclosure. FIG. 6 shows waveforms for first and second power control signals SAP, and SAN and for a subword line SWL in three different phases. In a first phase, the first and second power control signals SAP and SAN start out with their voltages at VSS and VNSG respectively. The subword line SWL starts out with its voltage at VNWL. During the first phase, the first and second power control signals SAP and SAN rise to VDRV and VPERI respectively. Then the second power control signal falls to VSS before the first power control signal fall to VSS forming a timing gap $\Delta T$ Vtc between the first and second power control signals. This first phase may be for compensating threshold voltage mismatches between components of a sense amplifier. In a second phase, the subword line rises from VNWL to VCCP causing a memory cell to be read. In this phase the first power control signal SAP goes high again from VSS to VDRV before the second power control signal SAN goes high again from VSS to VPERI forming a timing gap $\Delta T$ Sense between the first and second power control signals SAP and SAN. In the timing gap $\Delta T$ Sense, the sense amplifier is activated and starts amplifying a voltage difference between a pair of digit lines coupled to the memory cell. The widths of the timing gaps $\Delta T$ Vtc and $\Delta T$ Sense are critical for sensitivity and speed of the sense amplifier to sense and amplify the voltage difference between the pair of digit lines as shown by two dotted lines in FIG. 6 as discussed further below.

As was shown in FIG. 4A, the power control circuit 430 uses VDRV and VCCP to provide the power control signal SAP. Further, the power control circuit 430 uses VPERI to provide the power control signal SAN. In certain situations, VCOMP, VDRV and VPERI may be provided by an external power supply having no temperature dependency, whereas VCCP may be provided internally within the apparatus and may have a temperature dependency. Because of this difference in their temperature dependent characteristics in the power supply voltages, the waveforms for the power control signals SAP and SAN may show different behavior in relation to their timing. For example, there is the timing gap as labeled as $\Delta T$ Vtc in FIG. 6 between the falling edges of the power control signals SAP and SAN. The width of the timing gap $\Delta T$ Vtc may change as temperature of the apparatus changes. For example, without the timing circuit 410 coupled to VCCP as shown in FIG. 4A, the timing gap $\Delta T$ Vtc would likely be narrower at a lower temperature than at a higher temperature. The falling rate of the power control signal SAP gets lower at a higher temperature because VCCP has a lower voltage at the higher temperature. In contrast, the falling rate of the power control signal SAN would not be affected as much as the power control signal SAP because the power control signal SAN relies on temperature independent power supply voltage VPERI. In a related manner, there is the timing gap $\Delta T$ Sense in FIG. 6 between the rising edges of the power control signals SAP and SAN. The width of the timing gap $\Delta T$ Sense may change as temperature of the apparatus changes. For example, without the timing circuit 410 coupled to VCCP as shown in FIG. 4, the timing gap $\Delta T$ Sense would likely be narrower at a higher temperature than at a lower temperature, because the rising rate of the power control signal SAP gets lower at a higher temperature as VCCP is at a lower voltage for higher temperature. In contrast, the rising rate of the power control signal SAN would not be affected as much as the power control signal SAP because the power control signal SAN relies on temperature independent power supply voltage VPERI without the timing circuit 410 coupled to VCCP. These changes in the width of the timing gap $\Delta T$ Sense may adversely affect operations of the sense amplifier 450.

The dotted lines in FIG. 6 show an example of the sense amplifier circuit 454 detecting a difference in a pair of digit lines coming from memory cells. Within the timing gap $\Delta T$ Sense between the power control signals SAP and SAN, the voltage difference in the pair of digit lines is further amplified. The width of the timing gap $\Delta T$ Sense may influence operation of the sense amplifier circuit. In order to provide a more appropriate gap width throughout the operation temperature range of the apparatus, the temperature dependent circuit 410 is coupled to VCCP, and consequently, has temperature dependency as will be explained in more detail in relation to FIG. 8 below.

FIG. 7A is a schematic diagram of a part of an apparatus 700 including a power control circuit 710 that includes a timing circuit 720 according to another embodiment of the disclosure. In addition to the timing circuit 720, the power control circuit 710 includes SAP1, SAP2, SAN1, and SAN2 driver circuits 740, 750, 760 and 770. The timing circuit 720 coupled to the SAN1 driver circuit 760 exhibits a temperature dependency based on having VCCP as an input that may be similar to the temperature dependency of SAP1 driver circuit 740 as it includes a driver 742 coupled to VCCP. The SAP1 driver circuit 740 further includes an AND logic gate 741, an inverter 744 and an inverter 746 coupled to VDRV. The SAP2 driver circuit 750 includes an AND logic gate 751, a driver 752 coupled to VCCP, an inverter 754 and an inverter 756 coupled to VDRV. The SAN2 driver circuit 760 includes an AND logic gate 761, an inverter 764 and an inverter 766 coupled to VPERI. The timing circuit 720 also coupled to the SAN2 driver circuit 770 exhibits a temperature dependency based on VCCP that may be similar to the temperature dependency of the SAP2 driver circuit 750 as it includes the inverter 752 coupled to VCCP. As a result, the power control signals SAN1 and SAN2 may be affected by the VCCP temperature dependency in a similar manner as the power control signals SAP1 and SAP2. Thus, changes to the timing of the power control signals SAN1 and SAN2 may be similar to changes to the timing of the power control signals SAP1 and SAP2. This way, operation of a sense amplifier 780 is less likely to be affected by temperature fluctuations.

The timing circuit 720 may include a driver 722. The driver 722 may include two inverters coupled in series and receive a first input signal from an address decoder or a command decoder and VCCP as a second input. In response to the first input signal, the timing circuit 720 outputs a timing signal. The SAP1 driver circuit 740 includes the AND logic gate 741 having an input 743 and another input 745, The input 743 may receive an input signal from a bank logic and the input 745 may receive a test control signal tmF from the bank logic. The tmF signal may be an inverted test mode signal that can cause the apparatus 100 to enter a test mode. When the tmF signal is low, the power control circuit 710 is inactive. When the tmF signal is high, the power control circuit 710 is active. The SAP1 driver circuit 740 further includes a driver 742, inverters 744 and 746 coupled in series to output a power control signal SAP1. The SAP2 power control circuit 750 also includes the AND logic gate 751 having two inputs. One input may receive the input signal from the bank logic and the other one may receive the tmF signal also from the bank logic. The SAP2 driver circuit 740 further includes a driver 752, inverters 754 and 756 coupled in series to output a power control signal SAP2. The SAN1 power control circuit 760 includes an AND logic gate 761 having an input 763 and an input 765. The input 763 may receive the timing signal from the timing circuit 720 and the input 763 may receive the tmF signal from the bank logic. The SAN1 power control circuit 760 further includes inverters 762 and 764 coupled in series to output a power control signal SAN1. The SAN2 power control circuit 770 includes an AND logic gate 771 having an input 773 and another input 775. The input 773 may receive the timing signal from the timing circuit 720 and the input 775 may receive the tmF signal from the bank logic. The SAN2 power control circuit 770 further includes inverters 744 and 746 coupled in series to output a power control signal SAN2. The timing signal from the timing circuit 720 of the power control circuit 710 exhibits a temperature dependency based on the voltage VCCP that may be similar to the temperature dependency of the driver 742 of the SAP1 driver circuit 740. As a result, the power control signal SAN1 may be affected by the VCCP temperature dependency in a similar manner as the power control signal SAP1. Thus, changes to the timing of the power control signals SAN1 may be similar to changes to the timing of the power control signal SAP1. Similarly, the timing circuit 720 of the power control circuit 710 exhibits the temperature dependency based on the voltage VCCP that may be similar to the temperature dependency of the driver 752 of the SAP2 driver circuit 750. As a result, the power control signal SAN2 may be affected by the VCCP temperature dependency in a similar manner as the power control signal SAP2. Thus, changes to the timing of the power control signals SAN2 may be similar to changes to the timing of the power control signal SAP2. This way, operation of a sense amplifier 780 is less likely to be affected by temperature fluctuations as discussed below.

FIG. 7B is a schematic diagram of a sense amplifier 780 according to another embodiment of the disclosure. The sense amplifier 780 includes two n-type transistors coupled in parallel between VARY and a first node 782 of a sense amplifier circuit 786. The sense amplifier 780 also includes two n-type transistors coupled in parallel between VSS and a second node 784 of the sense amplifier circuit 786. Two inputs of the sense amplifier 786 are coupled to a pair of digit lines DL and DLB from memory cells. A voltage difference between the pair of digit lines DL and DLB is detected and amplified by the sense amplifier circuit 786. As shown in FIG. 7A, the driver 742 and 752 are powered by VCCP having the temperature dependent characteristic as discussed above. The inverter 756 is powered by VCOMP having a temperature independent characteristic. Thus, both of the power control signals SAP1 and SAP2 show the temperature dependent characteristic. In contrast, the inverters 764 and 774 of the driver circuits SAN1 and SAN2 respectively are powered by VPERI having the temperature independent characteristic. Thus, without relying on the timing circuit 720 which will be described in detail later, the power control signals SAN1 and SAN2 may show different rate for their rising and falling edges as described in relation to FIG. 6 above. This may adversely affect detection of the voltage difference between the pair of digit lines DL and DLB. In order to mitigate this adverse effect, the timing circuit 720 coupled to VCCP is used. The timing circuit 720 is an example of the timing circuit 800 as this will be described in more detail in relation to FIG. 8 below.

Figure 8:
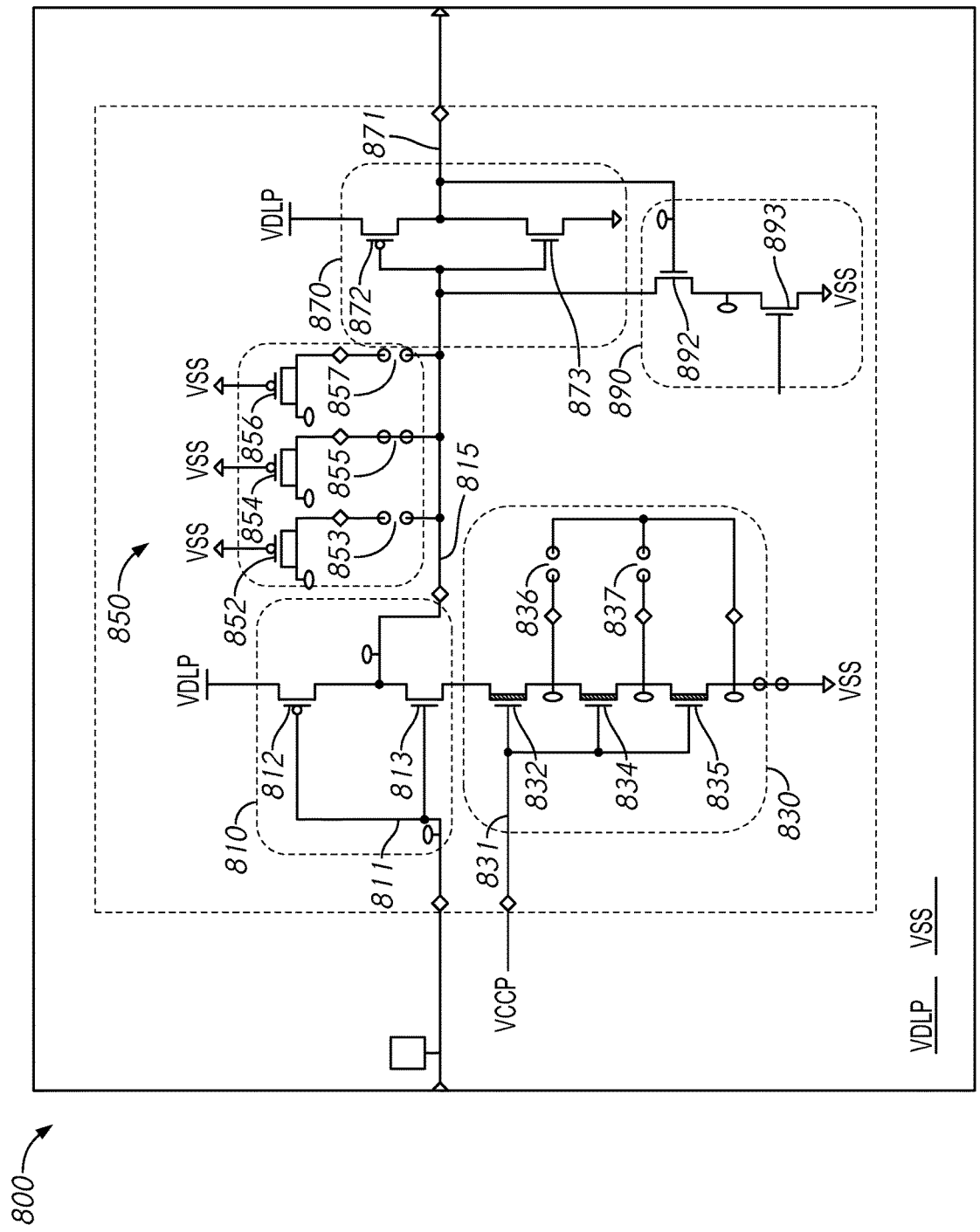
FIG. 8 is a circuit diagram of a timing circuit according to an embodiment of the disclosure.

FIG. 8 is a circuit diagram of a timing circuit 800 according to an embodiment of the disclosure. The timing circuit 800 includes an inverter 810, a timing delay 830, a capacitive delay 850, an inverter 870 and a latch 890. The inverter 810 includes a p-type transistor 812 and a n-type transistor 813. The inverter 810 further includes a first input 811, and a first output 815 coupled to the inverter 870. Gates of the transistors 812 and 813 are coupled to the first input 811. A drain of the p-type transistor 812 and a drain of the n-type transistors 813 are coupled to the first output 815. A drain of the n-type transistor 813 is coupled to the timing delay 830. The timing delay 830 includes n-type transistors 832, 834 and 835 coupled in series. A drain of the n-type transistor 832 is coupled to the drain of the p-type transistor 813 of the inverter 810. The timing delay 830 has a second input 831 coupled to VCCP, and contact options 836 and 837 coupled to sources of the n-type transistors 832 and 834 respectively. The capacitive delay 850 includes capacitors 852, 854 and 856. First sides of the capacitors 852, 854 and 856 are coupled to VSS and second sides of the capacitors 852, 854 and 856 are coupled to first sides of contact options 853, 855 and 857 respectively. Second sides of the contact options 853, 855 and 857 are coupled to the first output 815. The inverter 870 includes a p-type transistor 872 and a n-type transistor 873. Gates of the p-type transistor 872 and the n-type transistor 873 are coupled to the first output 815. Drains of the p-type transistor 872 and the n-type transistor 873 are coupled to a second output 871. A source of the p-type transistor 872 is coupled to VDLP and a source of the n-type transistor 873 is coupled to VSS. The latch 890 include transistors 892 and 893 coupled in series. A drain, a gate and a source of the transistor 892 are coupled to the first output 815, the second output 871 and a drain of the transistor 893 respectively. A drain, a gate and a source of the transistor 893 are coupled to the source of the transistor 892, an enable input and VSS respectively.

The timing delay 830 may include a plurality of n-type transistors coupled in series. In the example shown in FIG. 8, three n-type transistors 832, 834 and 835 are coupled in series. However, the number of these n-type transistors coupled in series is not limited to three, any number of transistors can be coupled in series to allow for an optimized temperature dependent timing based on VCCP which is coupled to each gate of these n-type transistors. As VCCP has a higher voltage than other voltages such as VDLP, VCOMP, and VPERI, each gate of these n-type transistors may have a thicker gate oxide than that of other transistors in the apparatus to accommodate for a higher gate voltage tolerance. Having the plurality of the n-type transistors 832, 834 and 836 coupled to the source of the n-type transistor 814 causes the inverter 810 to exhibit temperature dependent behavior mainly due to the temperature dependent nature of VCCP. The gate thickness of these n-type transistors 832, 834 and 836 are thicker than the other n-type transistors in the timing circuit 800, gate voltage of each of the n-type transistors 832, 834 and 836 can withstand VCCP voltage. As the gates of the n-type transistors 832, 834 and 836 are coupled to VCCP, the conductivities of the transistors change to reflect the temperature dependent characteristic of VCCP. At a high temperature, the conductivities would be lower compared to at a lower temperature, because VCCP has a lower voltage at the higher temperature. In this manner, timing of the timing circuit 800 exhibits the temperature dependency similar to that of a power control circuit 900 which will be described in detail below. In some embodiments of the disclosure, a size of each transistor in the inverter 810 and the timing delay 830 may influence operation behavior related to temperature dependency. For example, increasing a width of the n-type transistor 814 may increase temperature dependency of delay as well as reduce variations of delay, as such determining appropriate sizes for these transistors may be performed.

In the timing delay 830, one or more of contact options may be implemented as shown in FIG. 8. In FIG. 8, when a first contact option 836 is connected to VSS, the n-type transistor 832 is enabled to be effective and the n-transistors 834 and 836 are disabled. When the first contact option 836 is open, but a second contact option 837 is connected, the n-type transistors 832 and 834 are enabled and the n-type transistor 836 is disables. Such contact option implementations help adjust the temperature dependent characteristic of these circuits.

Additional contact options to enable certain capacitive transistors in the capacitive delay 850 may be implemented to further adjust the temperature dependent characteristic of these circuits. As shown in FIG. 8, the capacitive delay 850 may include capacitors 852, 854 and 856 coupled in parallel between VSS and the first output 815 of the inverter circuit 810 via contact options 853, 855 and 857, The second sides of the capacitors 852, 854 and 856 may be coupled to the contact options 853, 855 and 857 respectively. When the contact option 853 is connected and the contact options 855 and 857 are open, the capacitor 852 is effective as a capacitor. When the contact options 852 and 854 are connected and the contact option 856 is open, the capacitors 852 and 854 are effective as capacitors. These contact options may help the timing circuit 800 to finely tune the timing of the power control signals SAP and SAN to achieve an optimal operating range for the apparatus.

Figure 7:
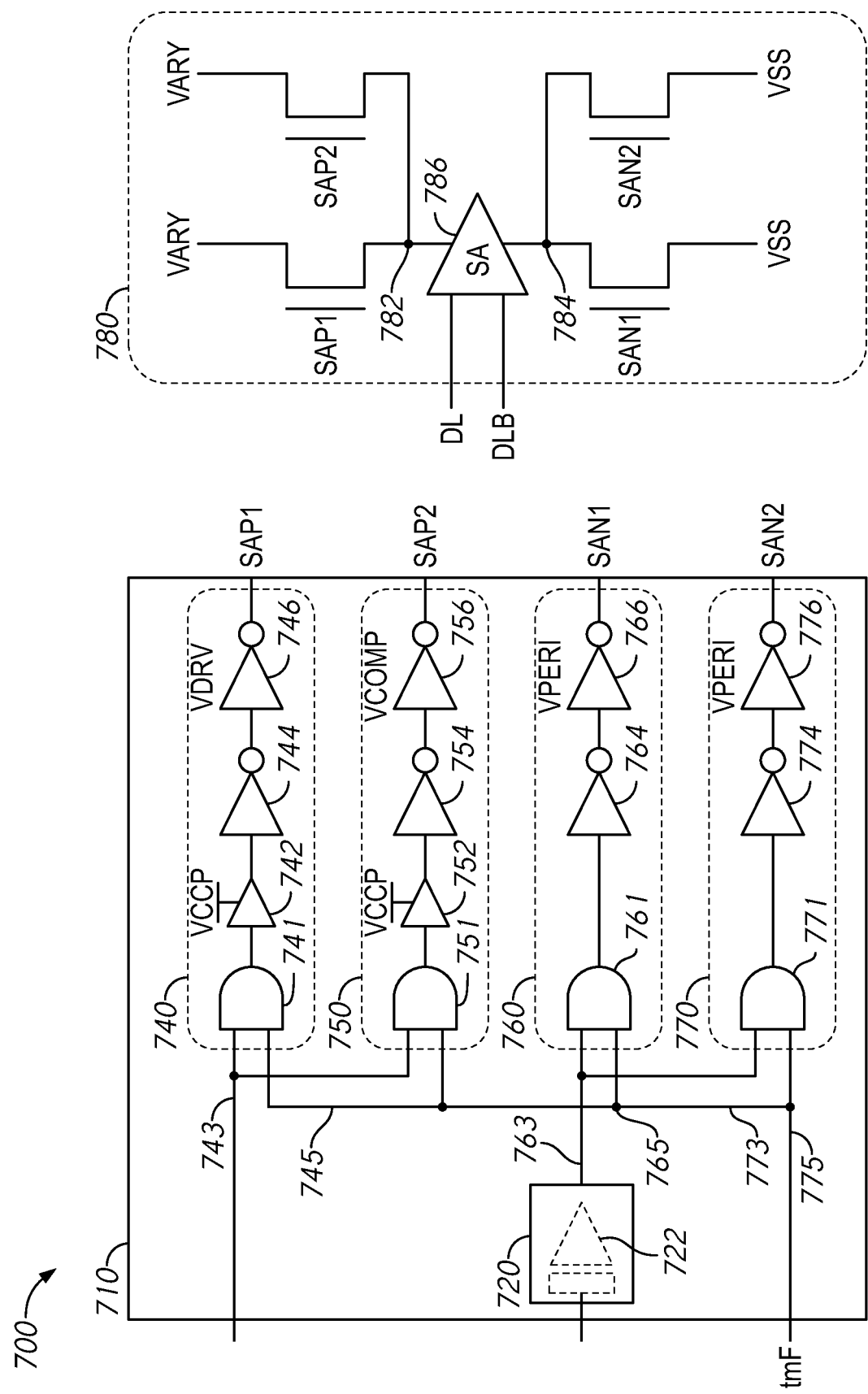
FIG. 7A is a schematic diagram of a timing circuit and a power control circuit according to another embodiment of the disclosure.
FIG. 7B is a schematic diagram of a sense amplifier according to another embodiment of the disclosure.
Figure 9:
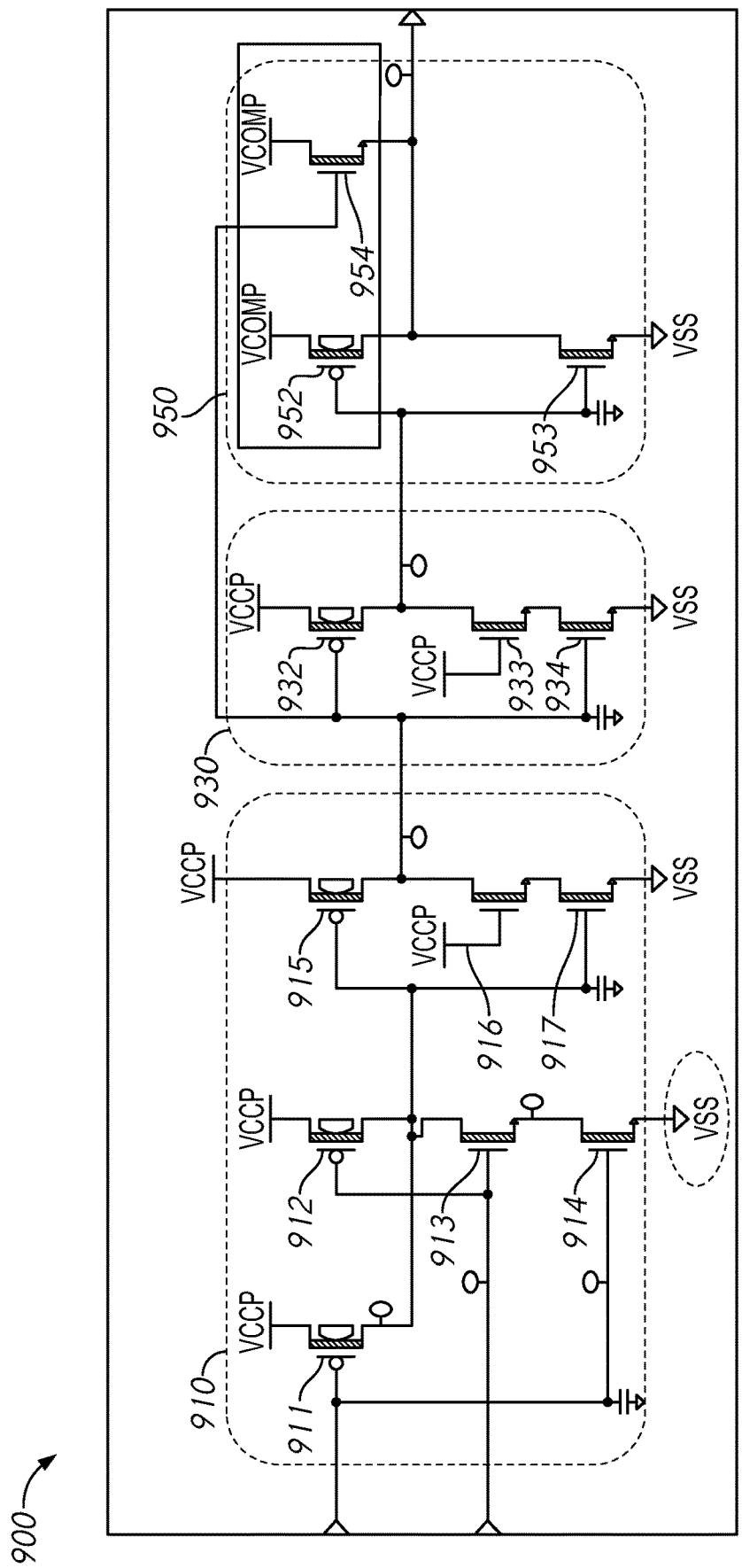
FIG. 9 is a circuit diagram of a power control circuit for providing a sense amplifier power control signal according to an embodiment of the disclosure.

FIG. 9 is a power control circuit 900 for a power control signal SAP according to an embodiment of the disclosure. The power control circuit 900 includes a two input driver 910, an inverter 930, and an inverter 950. As shown in FIG. 9, the two input driver 910 relies on VCCP and VSS for its power. As such, this driver exhibits temperature dependent characteristic. The inverter 930 also relies on VCCP and VSS for its power. On the other hand, the inverter 950 relies on VCOMP and VSS for its power. As discussed earlier in relation to FIG. 5, VCCP shows temperature dependent characteristic, whereas VCOMP is temperature independent. When the two input driver 910, the inverters 930 and 950 are coupled in series to form the power control circuit 900 for SAP, it exhibits temperature dependent characteristic as shown in FIG. 7. As discussed in relation to FIG. 8, the timing circuit 800 may be an example of the driver 420 coupled to VCCP included in the power control circuit 430 to add a temperature dependent characteristic to the power control signal SAN. This way, both the power control signals SAP and SAN have temperature dependent characteristics to optimize the timing gaps between the power control signals SAP and SAN when sensing the voltage difference in the pair of digit lines from memory cells. Similarly, the timing circuit 800 may be an example of the driver 722 included in the power control circuit 710 coupled to VCCP to add a temperature dependent characteristic to the power control signals SAN1 and SAN2. This way, the power control signals SAP1, SAP2, SAN1 and SAN2 have temperature dependent characteristics to optimize the timing gaps between the signals when sensing the voltage difference in the pair of digit lines from memory cells.

Figure 10:
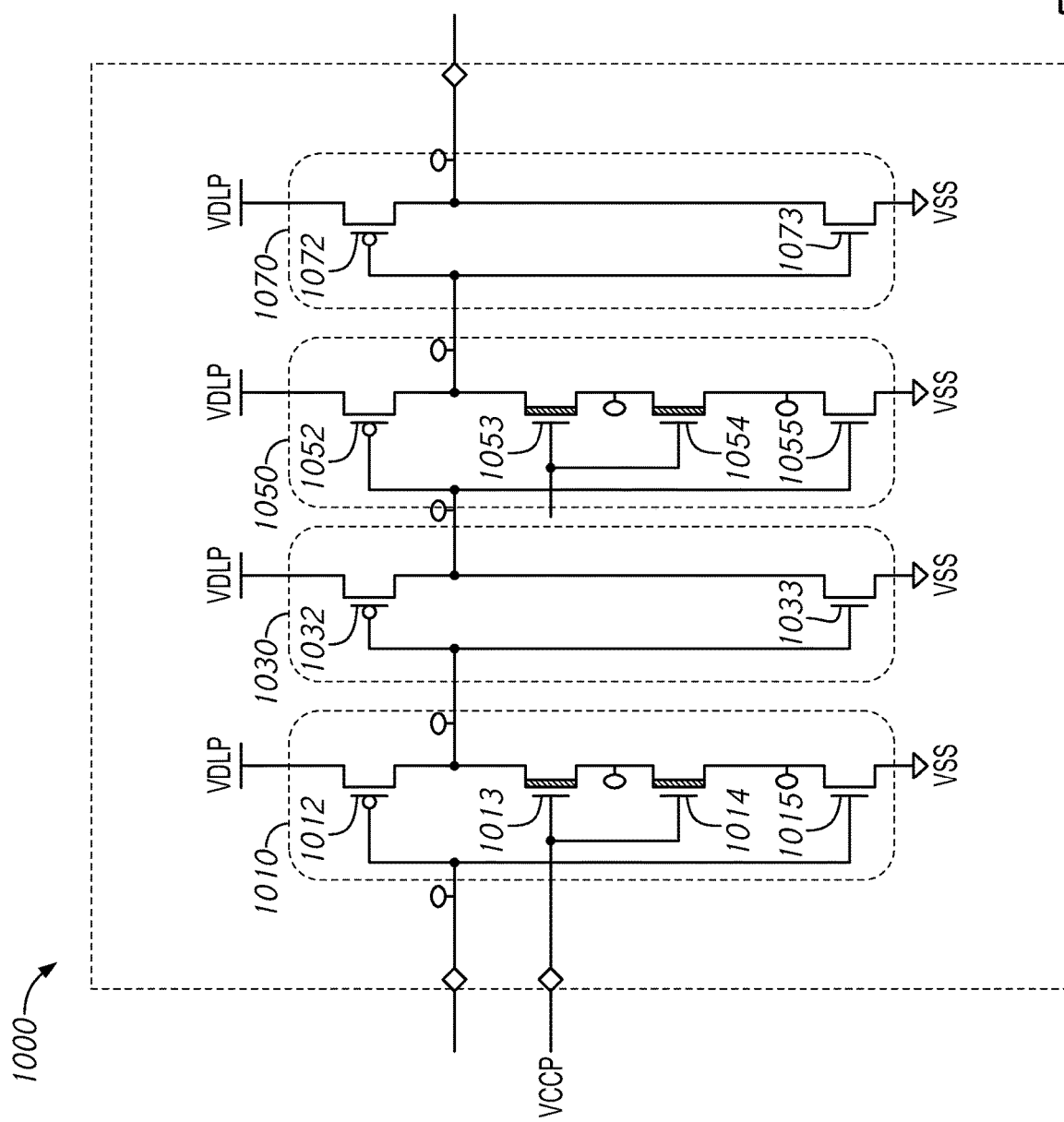
FIG. 10 is a circuit diagram of a timing circuit according to anotherembodiment of the disclosure.

FIG. 10 is a circuit diagram of a timing circuit 1000 according to another embodiment of the disclosure. The timing circuit 1000 may be an example of the drivers 420 and 722 of the power control circuits 430 and 730 respectively. The timing circuit 1000 may include four inverters 1010, 1030, 1050 and 1070 coupled serially. Of these inverters, the inverter 1010 has two n-type transistors 1013 and 1014 coupled in series between a drain of a p-type transistor 1012 and a drain of a n-type transistor 1015. Gates of the n-type transistors 1013 and 1014 are coupled to VCCP. Similarly, the inverter 1050 has two n-type transistors 1053 and 1054 coupled in series between a drain of a p-type transistor 1052 and a drain of a n-type transistor 1055. Gates of the n-type transistors 1053 and 1054 are coupled to VCCP. Each gate of the n-type transistors 1013, 1014, 1053 and 1054 may have a thicker gate oxide film compared to gate oxide films of other transistors as each gate of the n-type transistors 1013, 1014, 1053 and 1054 is coupled to VCCP which has a higher voltage than other power supply voltages such as VDLP. Because each gate of the n-type transistors 1013, 1014, 1053 and 1054 is coupled to VCCP, timing of the inverters 1010 and 1050 cause the power control signal SAN to show a temperature dependent characteristic so that in combination with the power control signal SAP, the sense amplifier may operate in a more favorable manner, From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
a power control circuit including:
a timing circuit, configured to be coupled to a first power supply, configured to receive a first input signal and provide a first timing signal responsive to the first input signal;
a first driver circuit configured to be coupled to the first power supply and configured to provide a first control signal; and
a second driver circuit coupled to a second power supply and configured to receive the first timing signal and provide a second control signal; and
an amplifier including:
a sense amplifier circuit configured to amplify a voltage difference between a pair of complementary signal lines;
a first transistor having a first gate configured to receive the first control signal and further having a first drain coupled to the sense amplifier circuit; and
a second transistor having a second gate configured to receive the second control signal and further having a second drain coupled to the sense amplifier circuit,
wherein the first power supply is configured to provide a temperature dependent voltage and the first control signal and the first timing signal have temperature dependent timings based on the temperature dependent voltage, and the timing of the second control signal is based on the first timing signal.

2. The apparatus of claim 1, wherein the temperature dependent voltage is provided to the first driver circuit.

3. The apparatus of claim 1, wherein the first driver circuit of the power control circuit comprises a first driver, a first inverter and a second inverter coupled in series, and the second driver circuit comprises a second inverter and a third inverter coupled in series,
wherein the first driver is configured to be coupled to the first power supply.

4. The apparatus of claim 3, wherein the second inverter is configured to be coupled the second power supply, and the third inverter is configured to be coupled to a third power supply.

5. The apparatus of claim 4, wherein the sense amplifier is configured to be coupled to a fourth power supply and a fifth power supply.

6. The apparatus of claim 5, wherein the second power supply, the third power supply, the fourth power supply and the fifth power supply are configured to provide temperature independent voltages.

7. The apparatus of claim 4, wherein the first power supply is configured to provide a higher voltage than the second and third power supplies.

8. The apparatus of claim 7, wherein the first power supply is configured to provide a higher voltage than the fourth power supply.

9. An apparatus comprising:
a power control driver including:
- a timing circuit, coupled to a first power supply, configured to receive a first input signal and provide a first timing signal responsive to the first input signal;
- a first driver circuit coupled to the first power supply and configured to receive a test control signal and further configured to provide a first control signal; and
- a second driver circuit coupled to the second power supply and configured to receive the test control signal and the first timing signal and further configured to provide a second control signal,
- a third driver coupled to the first power supply configured to receive the test control signal and to provide a third control signal, and
- a fourth driver coupled to the second power supply configured to receive to the test control signal and the first timing signal and further configured to provide a fourth control signal, an amplifier including:
- a sense amplifier circuit configured to amplify a voltage difference between a pair of complementary signal lines;
- a first transistor having a first gate configured to receive the first control signal and a first drain coupled to the sense amplifier circuit;
- a second transistor having a second gate configured to receive the second control signal and a second drain coupled to the sense amplifier circuit,
- a third transistor having a third gate configured to receive the third control signal and a third drain coupled to the sense amplifier circuit, and
- a fourth transistor having a fourth gate configured to receive the fourth control signal and a fourth drain coupled to the sense amplifier circuit, wherein the first power supply is configured to provide a temperature dependent voltage and the first, second, third and fourth control signals have temperature dependent timings based on the temperature dependent voltage, and the timing of the second and fourth control signals are based on the first timing signal.

* * * * *